United States Patent [19]

Tedeschi

[11] 4,343,585
[45] Aug. 10, 1982

[54] ARTICLE HANDLING METHODS INCLUDING REORIENTING RANDOMLY MISORIENTED ARTICLES

[75] Inventor: Anthony Tedeschi, Raytown, Mo.

[73] Assignee: Western Electric Co., Inc., New York, N.Y.

[21] Appl. No.: 146,719

[22] Filed: May 5, 1980

[51] Int. Cl.³ ............................................. B65B 1/04
[52] U.S. Cl. ..................................... 414/403; 53/246; 53/544; 198/399; 414/404; 414/754; 414/786
[58] Field of Search ........................ 53/544, 539, 246; 198/381, 690, 400, 399; 414/403, 404, 416, 754, 779, 786

[56] References Cited

U.S. PATENT DOCUMENTS

| | | | |
|---|---|---|---|
| 3,480,165 | 11/1969 | Hurst et al. | 414/786 |
| 3,742,678 | 7/1973 | Wyatt | 198/381 X |
| 3,884,347 | 5/1975 | Gallagher et al. | 198/381 |
| 4,136,765 | 1/1979 | Abraham et al. | 198/381 |
| 4,161,245 | 7/1979 | Baggström | 198/399 |

*Primary Examiner*—Sherman D. Basinger
*Attorney, Agent, or Firm*—W. O. Schellin

[57] ABSTRACT

Initially randomly oriented elongated articles (11) are uniformly oriented and inserted into cavities (47) of a magazine (48) in a mass insertion process. The articles (11) are first aligned in parallel grooves (32) of a rack (31), wherein they initially retain a random longitudinal orientation. The articles (11) are then translated longitudinally in one or the other direction depending on their orientation in the rack. Those of the articles extending in the one longitudinal direction are first transferred to the magazine (48) while the other articles remain in the rack. The longitudinal orientation of the remaining articles is thereafter reversed by rotating the rack about its longitudinal axis, and the remaining articles are inserted into the magazine as the complement of such first transferred articles.

10 Claims, 8 Drawing Figures

ARTICLE HANDLING METHODS INCLUDING REORIENTING RANDOMLY MISORIENTED ARTICLES

TECHNICAL FIELD

This invention relates to handling a plurality of discrete articles and reorienting those of such articles which are randomly misoriented from a desired orientation. The invention relates particularly to handling elongated articles having a longitudinally offset physical characteristic.

BACKGROUND OF THE INVENTION

In the electronic components industry, efficient article handling techniques are ever-important to the manufacture of price-competitive products. Two distinct handling techniques for discrete articles are respectively referred to as sequential handling and mass handling. Each of these techniques have advantages and disadvantages, such that for a particular manufacturing operation one of these techniques may be preferred over the other.

U.S. Pat. No. 3,884,347 to Gallagher et al. and U.S. Pat. No. 4,136,765 to Abraham et al., both being assigned to the assignee of this application, show sequential handling of discrete articles. Each patent shows particular article handling methods and apparatus including selectively reorienting misoriented articles. Thus, in manufacturing operations using sequential handling techniques sequentially reorienting some articles with respect to others is known.

However, in the manufacture of articles, such as diodes, resistors or small mechanical switches, mass handling techniques may be preferred in preparing the articles for selected operations. Such mass handling techniques do not lend themselves to individual recognition of the orientation of articles and sequential reversal or reorientation of randomly misoriented ones.

As an example of typical mass handling techniques, U.S. Pat. No. 3,480,165 to Hurst et al., assigned to the assignee of this application, relates to handling discrete articles and particularly to loading a plurality of articles into a workholder. According to the Hurst et al. disclosure, paramagnetic diodes are magnetically aligned, picked up and transferred with a magnetic wand, and then loaded into an apertured workholder in spaced parallel relationship to one another. Typically for such mass handling techniques, the disclosed methods do not provide for reorienting misoriented articles.

SUMMARY OF THE INVENTION

Accordingly, an object of the invention is to provide new and improved methods of handling a plurality of discrete articles, which include reorienting randomly misoriented articles prior to placing them into a holder.

Another object of this invention is to efficiently identify misoriented articles in a plurality of selected articles.

A further object of the invention is to load a preselected plurality of articles having a random orientation into a holder, such that all of such articles assume a predetermined orientation in the holder.

Accordingly, the present invention contemplates handling a plurality of randomly oriented, elongated articles, which have a longitudinally offset physical characteristic. The articles are linearly arranged in substantially parallel alignment and with a random longitudinal orientation in either one of two mutually opposite directions. The arranged articles are longitudinally translated in a direction related to the offset of the physical characteristic in the one or the other of the two mutually opposite directions. Those of the longitudinally translated articles which extend in the one direction are transferred to a magazine. Thereafter, the longitudinal orientation of the remaining articles is reversed and the remaining articles are transferred to the magazine.

BRIEF DESCRIPTION OF THE DRAWING

Other features and advantages of the invention will become apparent from the detailed description below when read with reference to the accompanying drawing, wherein.

DETAILED DESCRIPTION

Figure 1:
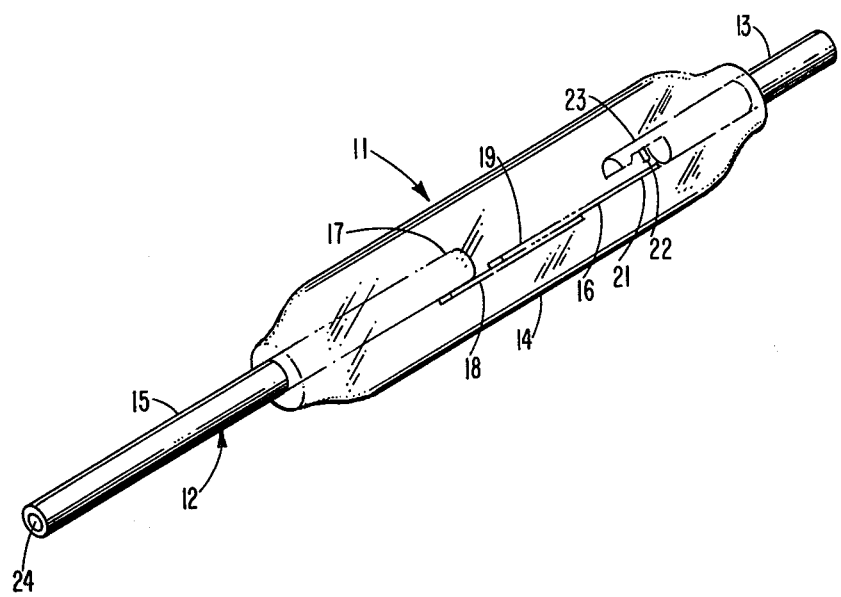
FIG. 1 is a pictorial representation of a partially completed mercury wetted sealed contact switch, as an example of an article of manufacture to which the invention described herein advantageously applies.

Referring to FIG. 1, there is shown a partially completed mercury-wetted sealed contact switch 11 as an example of an article of manufacture to which the methods and apparatus described herein advantageously apply. A stem assembly 12 and a polepiece 13 are sealed into, and partially protrude from, opposite ends of a generally cylindrical glass envelope 14. The stem assembly 12 includes a tubular stem 15 of magnetic material, such as Inconel. A flat, leaflike armature 16 is pivotally attached to an inner end 17 of the stem 15 through a reed spring 18 which is typically welded to the stem 15 and to an adjacent end 19 of the armature 16. As the armature 16 pivots about the spring 18, a free end 21 of the armature 16 typically moves toward and away from a contact 22 mounted to an inner end 23 of the polepiece 13.

During the further manufacture of the switch or article 11, a predetermined quantity of mercury (not shown) is introduced through a tubular access 24 of the stem 15 into the envelope 14. Thereafter, the envelope 14 is typically sealed by pinching off and welding the exposed end of the stem 15 in the presence of an inert gas under pressure. As a result of the sealing process, the gas becomes a constituent atmosphere within the envelope 14.

It has been found that magnetic reluctance properties are nonuniformly distributed along the length of the article 11 between the outer end of the stem and the outer end of the polepiece. A region of least magnetic reluctance of the stem 15 is advantageously used to identify the orientation of a plurality of the articles 11 in one of two possible directions. Such an identification is accomplished by a longitudinal translation or shift of each article 11 in the direction which pushes an end of the article having the greater magnetic reluctance away from a magnetic field. The observable longitudinal or axial shift of the articles 11 under the influence of the magnetic field is further used in accordance with this invention to separate the articles according to their orientation and to reorient some of the articles 11 into a preferred direction. A preferred handling sequence involving the magnetic properties of the articles 11 is best described in reference to FIGS. 2-6.

Figure 2:
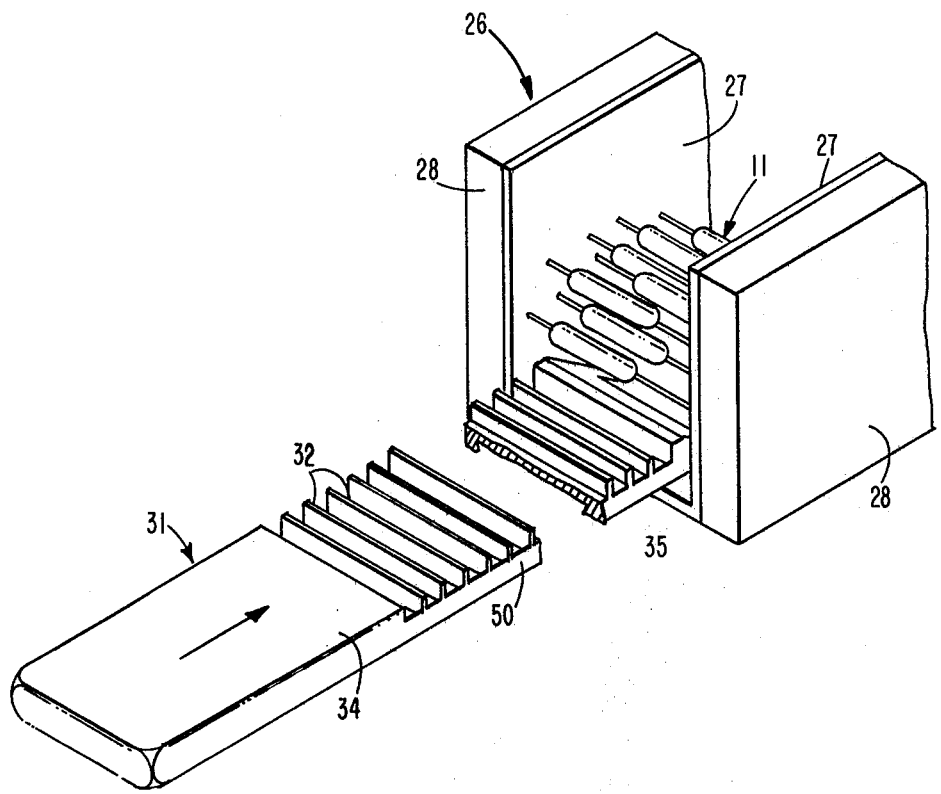
FIG. 2 shows a typical magnetic bin for suspending a plurality of the articles of FIG. 1 in parallel alignment.

FIG. 2 depicts a typical magnetic bin 26 wherein a plurality of the articles 11 of FIG. 1 are suspended in parallel alignment within a horizontal magnetic field extending between two side walls 27. The field is typically generated by permanent magnets 28 which are located on the outside of the side walls 27 of the bin 26. Within the magnetic field of the bin 26, the articles 11 have the tendency to space themselves in the lower portions of the bin.

Figure 3:
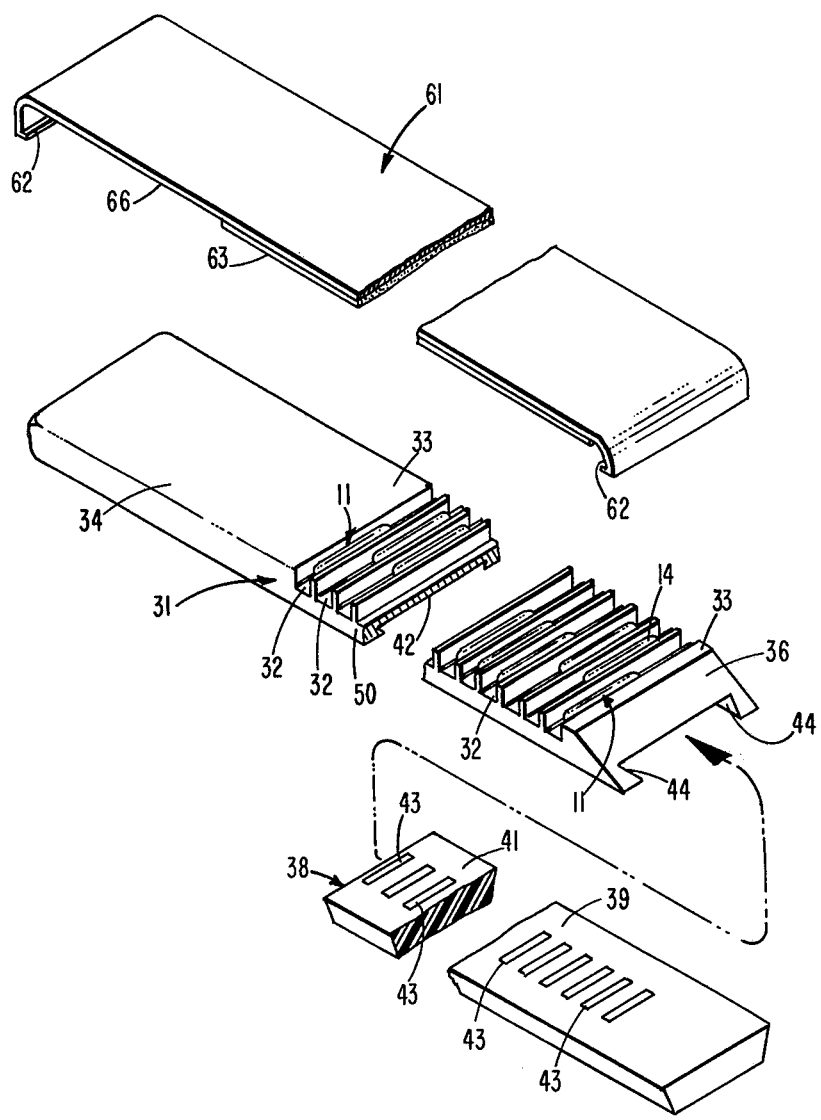
FIG. 3 is a pictorial view of a carrier rack for holding a preselected number of the articles of FIG. 1 in parallel alignment.

FIG. 3 depicts a carrier rack 31 for linearly arranging a predetermined number of the articles 11 in parallel alignment. A plurality of parallel surface grooves 32 in an upper surface 33 have a predetermined cross section to accept one of the articles 11 therein. The grooves 32 preferably have a depth such that one of the articles 11 located within such groove substantially occupies the groove and the exposed surface of the envelope 14 is substantially even with the surface 33. The length of the carrier rack 31 is determined by the number of the grooves 32 desired in the rack 31 and by the pitch or spacing between the grooves 32. The rack 31 extends further into a manipulator portion or handle 34 which preferably does not contain any of the grooves 32. The width of the rack 31 which is typically equal to the length of the grooves 32 is preferably the same as the overall length of the articles 11. While a small variation of the width, particularly toward a more narrow width, may still be acceptable, the more narrow width of the rack 31 undesirably reduces the amount of guiding of the articles 11 within the grooves 32, and an increased width affects the amount by which the articles 11 have to be shifted to extend over the lateral edges of the rack 31.

The rack 31 is inserted longitudinally into one end of the bin 26 near or along a base 35 of the bin. During this insertion, the grooves 32 of the rack are directed upward toward the articles suspended within the bin 26. A tapered leading edge 36 on the rack 31 may be helpful to guide any of the articles 11 away from the bottom of the bin 26 toward the grooved surface 33 of the rack. The rack 31 is preferably of a non-magnetic material such as, for example, aluminum or plastic. Thus, the insertion of the rack 31 into the bin 26 does not distort or relocate the parallel force lines of the magnetic field of the bin 26 and the articles 11 suspended within the bin tend to remain in parallel suspension.

As the rack 31 is inserted into the bin 26 near its base 35, and then slowly lifted, a number of the articles 11 suspended in the bin 26 contact the surface 33 and settle into the grooves 32. The rack 31 is now horizontally extracted from the bin 26, preferably toward the one end of the bin from which it was inserted. Vertical walls 37 of the grooves 32 tend to retain the captured articles 11, and the magnetic field in the bin 26 has been observed to retain and pull back, in relationship to the movement of the rack 31, those of the articles 11 located on the surface 33 of the rack 31 which have not settled into any of the grooves 32. Thus, when the rack 31 is horizontally removed from the bin 26 the articles 11 which are located in the grooves 32 are are withdrawn from the bin 26 without the necessity of magnetically holding such articles 11 in the grooves 32.

A further advantageous result of the magnetic flux lines in the bin 26 in interaction with the force of gravity has been observed as an aid to filling all of the grooves 32 with the articles 11. The magnetic flux lines within the bin are known to be strongest near the center of the bin 26. Thus when the rack 31 is raised to approximately the center of the bin or to a position slightly above the center, the switches 11 are actually urged into the grooves 32 by the combination of the greatest flux density of the bin 26 near its center and the pull of gravity on each of the articles 11. Therefore, as the rack 31 is horizontally extracted from the bin 26 articles 11 on the surface 33 move relative to the moving rack 31 as they are retained by the magnetic field of the bin. In contrast, the articles 11 occupying the grooves 32 remain in and move with the rack 31, being retained by the walls 37 of the grooves 21. As a result of the extraction of the rack 31 from the bin 26 in the manner described, each of the grooves 32 in the rack 31 is typically occupied by one of the articles 11 after the rack 31 has cleared the bin 26. It has thus been found unnecessary for the rack 31 to be equipped with special magnets at the bottom of each of the grooves 32 to remove the articles 11 from the magnetic field of the bin 26.

Figure 4:
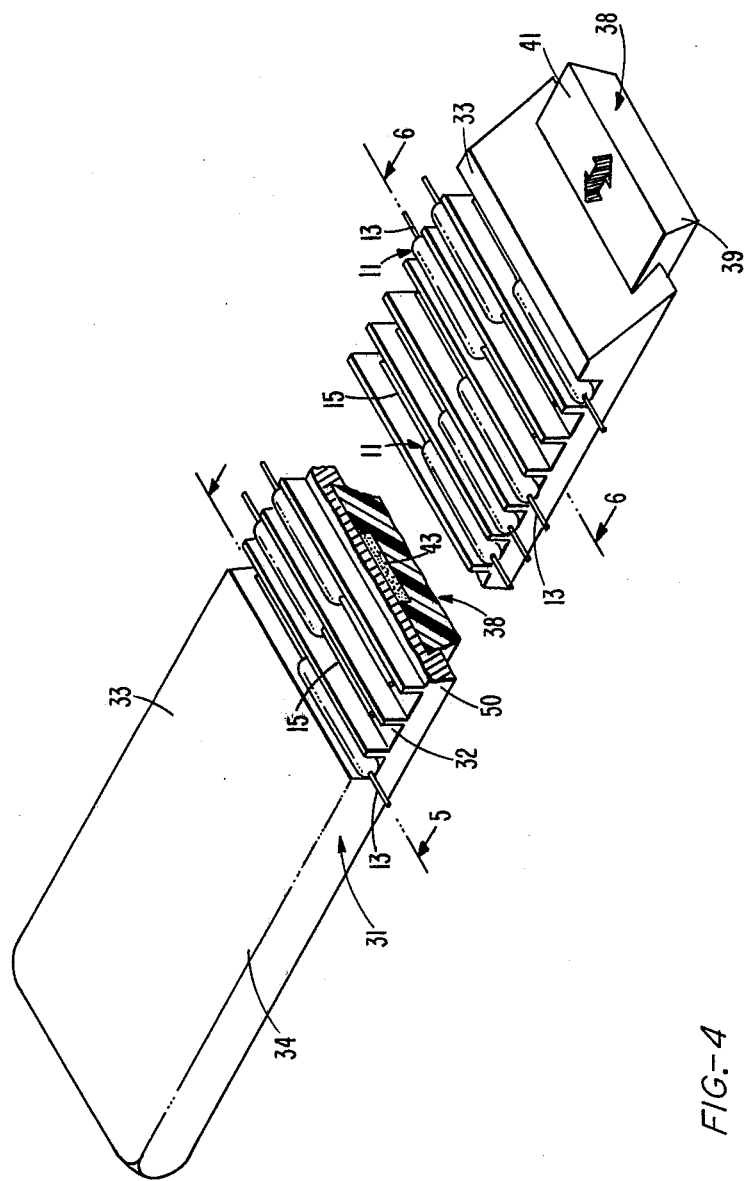
FIG. 4 shows the rack of FIG. 3 with the articles thereon in combination with a magnetic separator, the articles being longitudinally displaced in one of two opposite directions, depending on their respective orientation on the rack.

The rack 31 is removed from the bin 26, and is, preferably, slidingly engaged with a magnet base 38, as shown in FIGS. 3 and 4. The magnet base 38 is formed of a bar 39 having a surface 41 which moves against an undersurface 42 of the rack 31. The length of the magnet base 38 is about equal to the grooved portion of the rack 31. Adjacent to the surface 41 a plurality of spaced bar magnets 43 are embedded in the bar 39. The spacing of the magnets 43 corresponds to the spacing of the grooves 32 in the rack 31. Furthermore, the orientation of the polarity of all of the magnets 43 is the same in a direction parallel to that of the grooves 32 in the rack 31 as the rack 31 is slid over the base 38. Thus as the rack 31 slides into engagement with the base 38, guided preferably by dovetailed walls 44, the magnets 43 draw the portion of the articles 11 having the least reluctance into juxtaposition with themselves. As a result, the portions of the articles 11 having the greater magnetic reluctance, namely the polepieces 13, extend over one or the other of the lateral edges of the rack 31 depending on the orientation of the articles 11 in one or the other direction within the respective grooves 32. The magnet base 38 in effect becomes a magnetic separator of the articles to divide the articles 11 according to their orientation on the rack 31.

Figure 5:
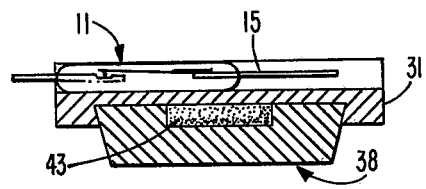
FIG. 5 is a sectional view through the rack, showing one of the articles and the magnetic separator of FIG. 4 along lines 5—5.
Figure 6:
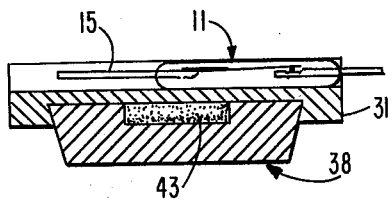
FIG. 6 is a sectional view through the rack, showing one of the articles and the magnetic separator of FIG. 4 along lines 6—6.

FIGS. 5 and 6 show, in section, the aligned relationship between the magnets 43 and the low reluctance stem portion of the article 11. In FIG. 5, the article 11 has undergone an axial shift to the left while in the view of FIG. 6 the respective article 11 has shifted to the right because of its orientation within the rack 31 opposite to the article 11 shown in FIG. 5. It should become apparent that a low coefficient of sliding friction between the articles 11 and the material of the rack 31 is of significance for inducing the articles 11 to undergo the shift in the axial direction. The glass of the envelopes 11 has typically a low coefficient of friction with many materials having smooth and hard surface characteristics such as aluminum or molded plastics. However, should the articles 11 be other than the described, exemplary switches, an appropriate substitution of materials and possibly modifications in shapes may be in order to provide a smooth, low friction contact between the articles 11 and the grooves 32.

Also in a broader sense, the articles 11 in the rack 31 may have physical distinctions which would indicate their orientation within the rack 31. If, for instance, the articles 11 were screws or nails, their respective heads extended over one or the other lateral edges of the rack 31 to indicate their orientation in the rack while the elongated bodies of such articles 11 occupied and filled the grooves 32. Thus, such screws or nails need not be shifted magnetically as it is done with the exemplary switches as articles 11. Of course, there are nonmagnetic methods to separate even the switches as articles 11 by, for instance, forming the grooves 32 to correspond to the physical shape of the switch. In such a rack the envelope portions of the articles 11 would settle into centered, shaped cavities, and the longer protruding stem would be compared with the lesser protruding polepiece to ascertain the orientation of the articles 11. However, the described magnetic separation of the articles 11 is preferred.

Figure 7:
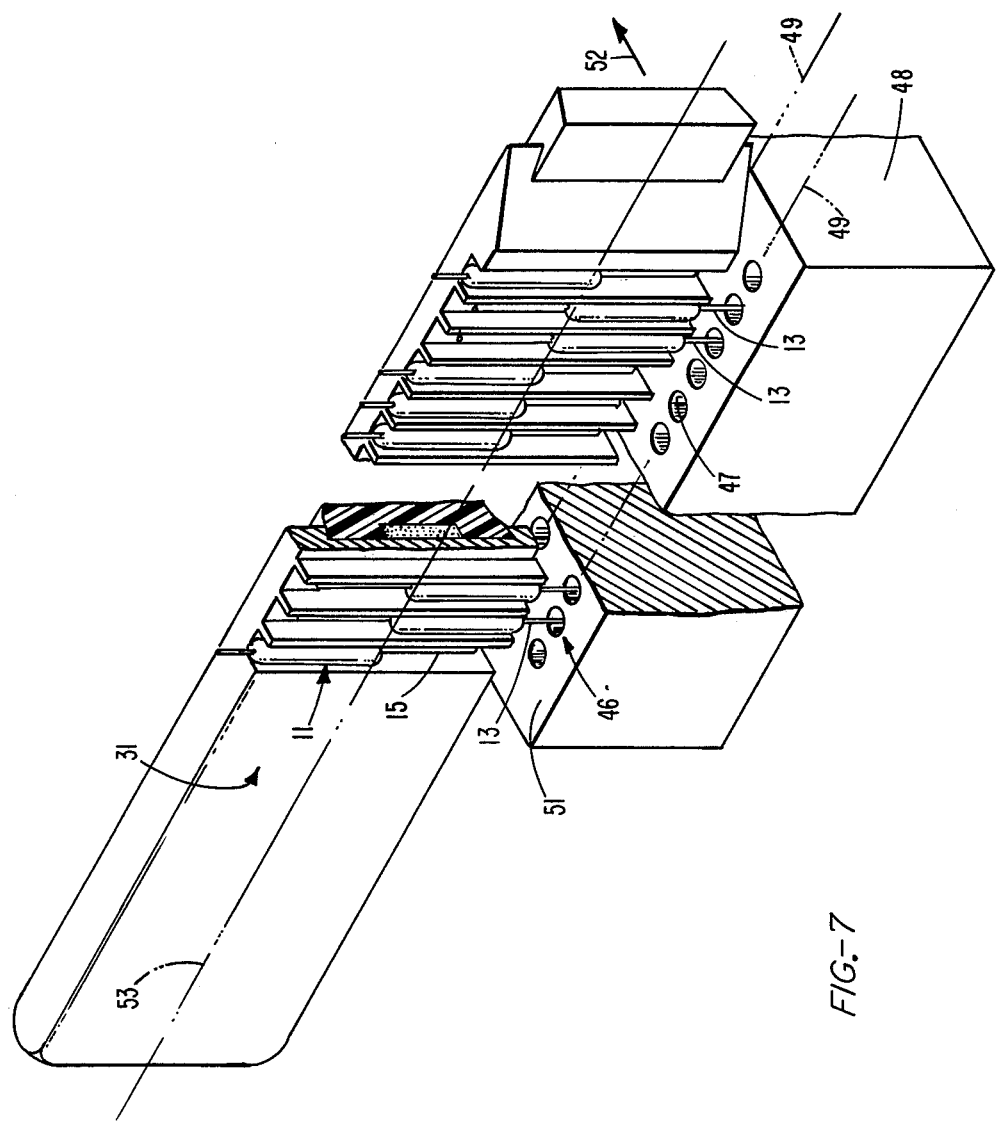
FIG. 7 is a pictorial representation of a portion of a magazine with an array of cavities, into a row of which articles of a first orientation are inserted.

After the articles 11 are held on the rack 31 with an axial offset in one direction or the other in accordance with their orientation on the rack 31, it may be desirable to transfer the articles to an array 46 of cavities 47 in a magazine 48 shown in FIG. 7. The cavities 47 are preferably in the shape of vertical, cylindrical shafts which permit one of the articles 11 to be inserted therein and to extend therefrom in an upright position. The array 46 of the cavities 47 is preferably an orthogonal array. A plurality of rows 49 of evenly spaced cavities are themselves evenly spaced as shown in FIGS. 7 and 8.

In FIG. 7, the rack 31 has been placed with an edge 50 against an upper surface 51 of the magazine 48 to insert the protruding polepieces 13 of the articles 11 into corresponding ones of the cavities 47 of a first row 49 of the array 46. During this insertion, the magnet base 38 remains in position on the rack 31. After the polepieces of the articles 11 which protrude over the edge of the rack 31 adjacent to the surface 51 of the magazine 48 have been inserted into respective cavities 47 of the first row 49, the rack 31 is shifted parallel to the surface 51, as indicated by arrow 52, perpendicularly away from such first row 49 of the cavities 47. The shift of the rack 31 causes the inserted articles 11 to be pulled from the rack, after which they drop and become fully inserted in the cavities.

The rack 31 is now raised away from the surface of the magazine 48 and inverted by rotating the rack 31 about its longitudinal axis 53 through 180 degrees. The inversion reverses the longitudinal orientation of the articles 11 remaining in the grooves 32 to impart to the articles 11 in the grooves 32 the same orientation as that of the articles 11 already inserted into the first row 49 of the array. It is to be noted that the group of articles 11 remaining in the rack 31 constitutes in number and in position the complement of the group of the articles 11 already inserted into the row 49. Consequently, after the first group of articles 11 with one orientation has been inserted into the first row 49 and the rack 31 is inverted, the articles 11 remaining in the rack 31 may now be inserted into the vacant cavities of such first row 49 to completely fill the row 49 with articles 11 all of which have an identical orientation.

Figure 8:
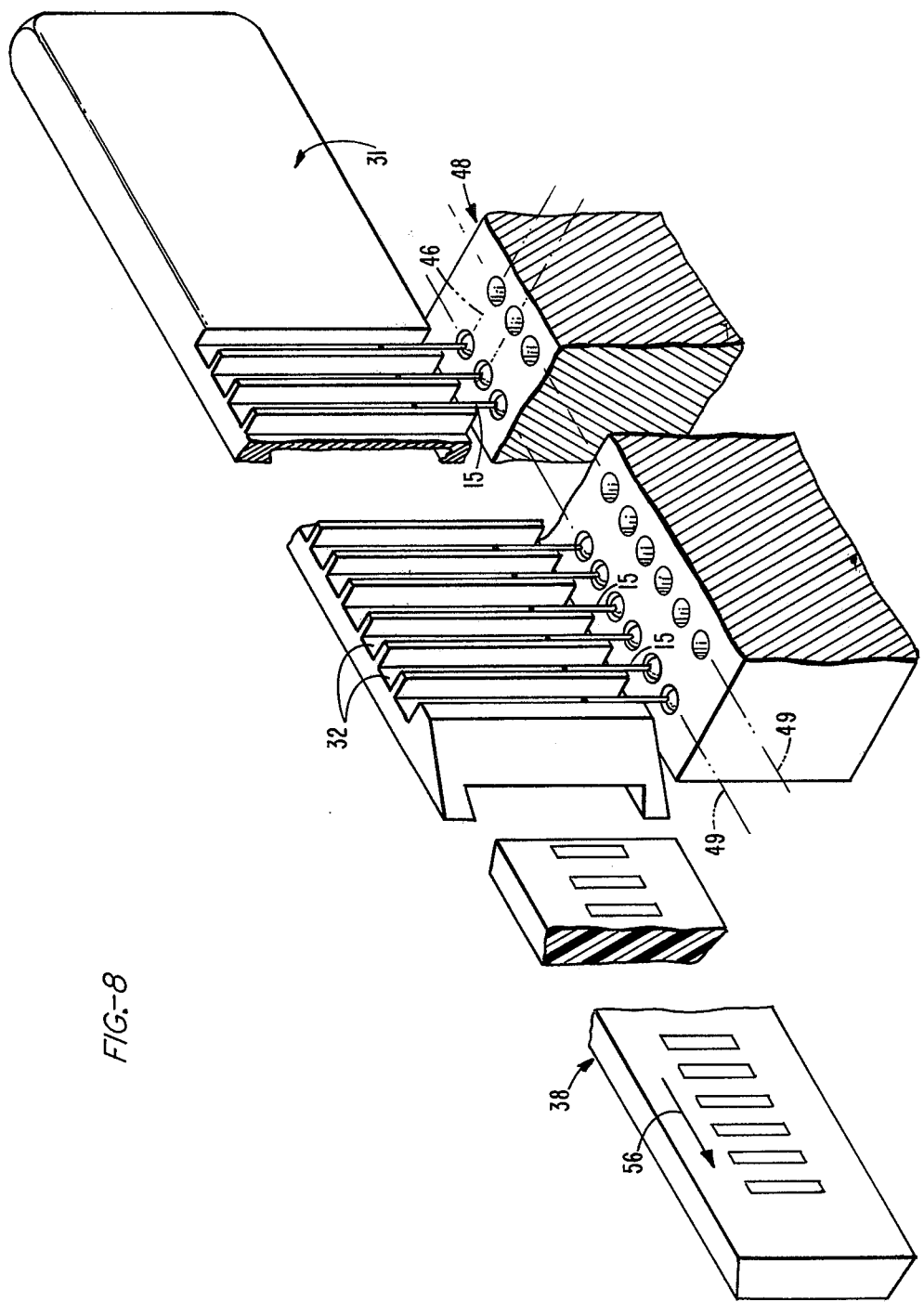
FIG. 8 shows a different view of the magazine of FIG. 7, the row of which is now occupied by the initially inserted articles and by the complement of such articles from the rack.

FIG. 8 shows the inverted rack 31 in position against the magazine 48 with the remaining articles 11 partially inserted into the previously vacant cavities 47 of the row 49. During the partial insertion of the remaining articles 11 at least some of the already inserted articles 11 may re-attach themselves to the now open grooves 32 in the rack 31. However, when the rack 31 is again shifted parallel to the surface 51 and perpendicular to the row 49, all of the articles 11 are extracted from the grooves 32 of the rack 31 and become fully inserted in the cavities. The number of the grooves 32 in the rack 31 corresponds to the number of the cavities 47 in each row 49 of the array 46. Therefore, each time the rack 31 removes and transfers the articles 11 from the bin 26 to the magazine, a subsequent row 49 of the array 46 of the magazine 48 becomes filled with the articles 11.

The transfer of the articles 11 to the array 46 in the magazine 48 requires that the rack 31 with the magnet base 38 is placed between the row 49 into which the articles 11 are currently being inserted and an adjacent row 49 already occupied by the articles 11, as seen in FIG. 8. The spacing of the rows 49, consequently, should accommodate the combined depths of the rack 31 and the magnet base 38.

The spacing of the rows 49 should also include a clearance to allow the rack 31 to be shifted parallel to the surface 51 and perpendicular to the rows 49 if the articles 11 are transferred to the array 46 in the manner previously described. The spacing of the rows 49 may be minimized, however, by an alternate, preferred method of transfer.

Accordingly, each row 49 is filled by initially placing the rack 31 between the row 49 into which the articles are to be inserted and the remaining empty rows 49 of the array 46, as already described with respect to FIG. 7. The rack 31 is then rotated about its longitudinal axis to reorient or invert the remaining articles 11, as previously described. The rack 31 is thereafter placed against the surface 51 of the magazine 48 such that the row 49 into which the articles 11 are being inserted lies between the rack 31 including the magnet base 38 and any empty rows 49 of the array 46 as shown in FIG. 8. Instead of now shifting the rack 31 parallel to the surface 51 of the magazine 46 and perpendicularly to the rows 49 to release the articles 11 from the rack 31, the magnet base 38 is now extracted from engagement with the rack 31 in a direction parallel to the rows 49. An arrow 56 in FIG. 8 indicates the direction of disengagement of the magnet base 38 from the rack. With the disengagement of the magnet base 38, the magnetic field is removed from the grooves 32 and the articles 11 are released from the rack 31 into their respective cavities 47 of the row 49. The rack 31 may now simply be lifted away from the magazine 48 without disturbance to the inserted articles 11.

The latter, preferred method of transferring and releasing the articles 11 to the cavities 47 of the array 46 eliminates the need for the clearance between adjacent rows 49 for the earlier described shift of the rack 31 to release the inserted articles. The spacing of the rows 49 is, consequently, minimized. This latter, preferred method also highlights an advantage of not having magnets permanently mounted in the grooves 32 of the rack 31 to attract and hold the articles 11. In the preferred embodiment the magnet base 38 is selectively engaged with, and disengaged from, the rack 31 to separate the articles 11 according to their orientation in the rack 31, to hold them in the grooves 32 and, finally, to permit them to be selectively released from the rack 31.

A special advantage accruing particularly to the described switches as articles 11 resides in the stem 15 being the portion of each article 11 which has the greatest permeance or least reluctance. Consequently, with the shift of the articles 11 along the grooves 32 as illustrated in FIGS. 5 and 6 to center the stem 15, the polepiece 13 becomes the portion of each article which extends laterally from the rack 31. Thus, the polepiece 13 of each article 11 is inserted into its respective cavity 47 of the array 46, and the stem 15 extends upward. The resulting orientation of such inserted article 11 is advantageous in that mercury may readily be introduced through the tubular access of the stem 15. During the introduction of the mercury, the orientation of the articles 11 in the array 47 of the magazine 48 allows access to the open ends of the stems 15 and the mercury is introduced into the envelopes with the aid of gravity.

The described article transfer or loading steps are preferably executed by an operator manipulating such basic tools as the rack 31 and the magnet base 38. The advantage of mass handling establishes a loading rate of the articles 11 into the magazine at a level where automated loading is not preferred. However, it is within the scope of this invention to combine the described elements such as the magnetic bin 26, the rack 31, the magnet base 38 and the magazine 48 into a common apparatus. Using commonly employed and commercially available mechanisms such as pivot arms and an x-y index table in conjunction with typical structural framework, the elements described herein may be routinely combined into such an apparatus. However, before embarking on such course of action, apparatus costs should be weighed against production quantity requirements.

However, a relatively simple modification of the described process may enhance the usefulness of the rack 31, particularly when it is desired to sort or transfer articles other than the described partially completed switches, and when the magnet base 38 is not desirably used for holding the articles 11 in the grooves 32 after the articles have been loaded into the rack 31. In FIG. 3 there is shown a cover 61 which is preferably of a transparent, plastic material. The cover 61 preferably has snap lugs 62 at each end thereof, to secure the cover 61 to the rack 31 and to prevent the articles 11 from accidentally being dumped from the rack 31. To improve a friction hold between the cover 61 and the articles 11, and thereby prevent axial movement of the articles 11 within the grooves 32, a resilient material such as a foam rubber pad 63 is advantageously applied to the underside 66 of the cover which lies against the articles 11 when the cover 61 is snapped over the rack 31.

Other changes and modifications may be made to the described process and to the tools or apparatus for executing the process without departing from the spirit and scope of this invention.

What is claimed is:

1. A method of handling a plurality of randomly oriented, elongated articles, each of such articles having nonuniform magnetic properties including a region of least magnetic reluctance which is longitudinally offset from the center of such article, comprising:
    linearly arranging such articles in substantially parallel alignment and with a random longitudinal orientation of said nonuniform magnetic properties in either one of two mutually opposite directions;
    subjecting each of the linearly arranged articles to a magnetic field which is concentrated in a linear region along said linearly arranged articles and is oriented in a direction parallel to the longitudinal extent of such articles for longitudinally translating such arranged articles and for drawing such region of least magnetic reluctance of each such article in the one or the other of the two mutually opposite directions toward the concentrated region of said field, whereby ends of the articles of relatively greater magnetic reluctance extend away from such linear arrangement in the one or the other of said mutually opposite directions;
    transferring to a magazine those of the articles extending in the one longitudinal direction;
    reversing the longitudinal orientation of the remaining articles; and
    transferring such remaining articles to the magazine.

2. A method according to claim 1, wherein linearly arranging such articles comprises:
    loading the articles into parallel grooves of a rack, each groove being of a width and a depth to accept a single one of such articles, the width of the rack corresponding substantially to the length of such articles, such that the articles become substantially aligned to a lateral edge of the rack.

3. A method according to claim 2, wherein loading the articles into parallel grooves of a rack comprises:
    suspending the articles with a random longitudinal orientation in a parallel magnetic field;
    moving the rack with the grooves directed toward the suspended articles such that the grooves are oriented longitudinally parallel to the articles; and
    engaging the articles with the rack to urge the articles into the grooves; and
    removing the rack substantially lengthwise from the field such that the articles which have occupied the grooves of the rack are retained therein and are removed from the field.

4. A method according to claim 1, which further comprises:
    laterally guiding the articles to retain such substantially parallel alignment while the articles move in a direction to align said region of least magnetic reluctance with said concentrated magnetic field, whereby the articles are translated in a direction opposite to the offset of the region of least magnetic reluctance from the center of such article.

5. A method according to claim 4, wherein the plurality of articles constitute a preselected number of articles, the magazine has at least one row of cavities corresponding in number to the preselected number of the articles and wherein:
    said articles extending in the one longitudinal direction are transferred to those of the cavities corresponding to the random pattern in which such articles extend in the one longitudinal direction; and said remaining articles are transferred as the complement to the cavities which remained vacant after the transfer of the articles extending in the one direction whereby each cavity in said at least one row becomes occupied by one of the articles after such remaining articles have been transferred.

6. A method according to claim 5, wherein each article includes an assembly of an envelope, a stem assembly and a polepiece for a mercury-wetted sealed contact switch, wherein the stem is the region of relatively low magnetic reluctance and wherein linearly arranging such articles comprises arranging each of such assemblies in one of a plurality of parallel grooves of a rack, said grooves having a width and a depth to accept one of such assemblies, the grooves having a spacing which corresponds to the spacing of the cavities in such at least one row of cavities in the magazine, the width of the rack corresponding substantially to the length of such assemblies, such that the assemblies located within the boundaries of the rack are substantially aligned to each other.

7. A method according to claim 6, wherein the rack is of a nonmagnetic material and linearly arranging said assemblies comprises:
suspending the assemblies substantially parallel to and aligned with one another in a magnetic field between walls of a magnetic bin;
advancing the rack toward the suspended assemblies such that the grooves are directed toward the assemblies;
engaging the assemblies with the rack to urge the assemblies into the groove; and
removing the rack from the suspended articles in a direction of the length of the rack, whereby those of the assemblies which encounter a vacant groove become seated therein, being held by the lateral walls of the grooves, whereas the remaining assemblies remain suspended within the bin.

8. A method according to claim 7, wherein subjecting each article to a magnetic field comprises:
engaging the rack with a magnet bar for supplying said magnetic field concentrated in the center of each of the grooves after engagement with the rack.

9. A method according to claim 8 wherein said at least one row of cavities is a plurality of rows of cavities in the magazine and adjacent ones of said rows are spaced to accept the rack and the magnet bar in a space adjacent one of the rows of cavities occupied by the assemblies while the grooves of the rack hold at least remaining ones of further assemblies in alignment with the cavities of a row adjacent to said one row of cavities; and wherein
transferring such remaining articles to the magazine comprises slidingly disengaging the magnet bar from the rack.

10. A method according to claim 9, wherein transferring to a magazine those of the articles extending in the one longitudinal direction comprises:
axially aligning with the cavities of one of the rows those of the assemblies extending in the one longitudinal direction;
moving the rack and such aligned assemblies toward the cavities until at least a portion of each of such aligned assemblies extends into a respective one of the cavities; and
moving the rack in a direction perpendicular to the lengths of the assemblies and of the rack to extract such aligned assemblies from hold of the magnetic field.

* * * * *